US012649877B2

(12) United States Patent
Kim et al.

(10) Patent No.: US 12,649,877 B2
(45) Date of Patent: Jun. 9, 2026

(54) ETCHANT COMPOSITION AND MANUFACTURING METHOD OF DISPLAY DEVICE USING THE SAME

(71) Applicant: Samsung Display Co., LTD., Yongin-si (KR)

(72) Inventors: Youngrok Kim, Anyang-si (KR); Kyu-Soon Park, Yongin-si (KR); Jong-Hyun Choung, Suwon-si (KR); Woo Jin Cho, Yongin-si (KR); Gyu Po Kim, Incheon (KR); Sung Min Kim, Incheon (KR); Jae Myeong Kim, Incheon (KR); Hyun Cheol Shin, Incheon (KR); Jun Dong Kim, Incheon (KR); Jun Young Hawng, Incheon (KR)

(73) Assignee: Samsung Display Co., Ltd., Yongin-Si (KR)

( * ) Notice: Subject to any disclaimer, the term of this patent is extended or adjusted under 35 U.S.C. 154(b) by 477 days.

(21) Appl. No.: 18/122,337

(22) Filed: Mar. 16, 2023

(65) Prior Publication Data

US 2023/0295503 A1 Sep. 21, 2023

(30) Foreign Application Priority Data

Mar. 18, 2022 (KR) ........................ 10-2022-0034050

(51) Int. Cl.

| | |
|---|---|
| *C09K 13/08* | (2006.01) |
| *H10K 59/12* | (2023.01) |
| *H10K 59/126* | (2023.01) |
| *H10K 71/20* | (2023.01) |
| *H10P 50/60* | (2026.01) |

(52) U.S. Cl.

CPC ......... *C09K 13/08* (2013.01); *H10K 59/1201* (2023.02); *H10K 59/126* (2023.02); *H10K 71/231* (2023.02)

(58) Field of Classification Search

None

See application file for complete search history.

(56) References Cited

U.S. PATENT DOCUMENTS

2014/0091052 A1* 4/2014 Nagashima ............... C23F 1/44 216/13
2014/0162403 A1* 6/2014 Okabe ....................... C23F 1/18 252/79.4
2014/0202987 A1* 7/2014 Nakata .................. G03F 7/0043 252/79.1

(Continued)

FOREIGN PATENT DOCUMENTS

KR 10-1310310 9/2013
KR 10-2019-0108773 9/2019

(Continued)

*Primary Examiner* — Shamim Ahmed

(74) *Attorney, Agent, or Firm* — Innovation Counsel LLP

(57) ABSTRACT

Embodiments provide an etchant composition that includes about 5.0 to about 20.0 wt % of a persulfate, about 0.01 to about 15.0 wt % of a sulfonic acid, about 0.01 to about 2.0 wt % of a fluorine compound, about 0.01 to about 5.0 wt % of a 4-nitrogen cyclic compound, about 0.01 to about 1.0 wt % of an amino acid including a hydrophobic group having at least two carbon atoms, and water A weight ratio of the amino acid to the 4-nitrogen cyclic compound is in a range of about 1:16 to about 1:60.

20 Claims, 4 Drawing Sheets

(56) References Cited

U.S. PATENT DOCUMENTS

| | | | | |
|---|---|---|---|---|
| 2015/0376463 | A1* | 12/2015 | Fu | C09K 3/14<br>438/693 |
| 2016/0185595 | A1* | 6/2016 | Chen | G03F 7/405<br>252/79.3 |
| 2017/0330762 | A1* | 11/2017 | Kamei | H01L 21/3212 |
| 2020/0172807 | A1* | 6/2020 | Kim | H01L 21/3213 |
| 2020/0190673 | A1* | 6/2020 | Lippy | C23F 1/34 |
| 2020/0392405 | A1* | 12/2020 | Kneer | C09K 13/00 |
| 2021/0189298 | A1* | 6/2021 | Hoogboom | G03F 7/426 |

FOREIGN PATENT DOCUMENTS

| | | |
|---|---|---|
| KR | 10-2019-0110171 | 9/2019 |
| KR | 10-2019-0111420 | 10/2019 |
| KR | 10-2020-0068131 | 6/2020 |

* cited by examiner

| Cu concentration | Example 1 | Example 30 | Example 31 | Example 44 | Example 45 |
|---|---|---|---|---|---|
| Straightness | | | | | |
| Cu concentration | Comparative example 1 | Comparative example 2 | Comparative example 3 | Comparative example 4 | Comparative example 5 |
| Straightness | | | | | |
| Cu concentration | Comparative example 6 | Comparative example 7 | Comparative example 8 | Comparative example 9 | Comparative example 10 |
| Straightness | | | | | |

ETCHANT COMPOSITION AND MANUFACTURING METHOD OF DISPLAY DEVICE USING THE SAME

CROSS-REFERENCE TO RELATED APPLICATION(S)

This application claims priority to and benefits of Korean patent application No. 10-2022-0034050 under 35 U.S.C. § 119, filed on Mar. 18, 2022, in the Korean Intellectual Property Office, the entire contents of which are incorporated herein by reference.

BACKGROUND

1. Technical Field

The disclosure relates to an etchant composition and a manufacturing method of a display device using the same.

2. Description of the Related Art

As a display device, a liquid crystal display (LCD), an organic light emitting diode display (OLED), and the like are used.

Such a display device includes multiple metal patterns. These metal patterns require certain quality such as high conductivity and low contact resistance, and through this, a stable image is to be realized.

The metal pattern may include a structure in which multiple layers made of different materials are stacked each other in order to achieve the above-described quality, and it is necessary to provide it in a stable form.

The above information disclosed in this Background section is only for enhancement of understanding of the background of the disclosure, and therefore, it may contain information that does not form the prior art that is already known in this country to a person of ordinary skill in the art.

SUMMARY

Embodiments have been provided in an effort to provide an etchant composition that etches a wire including copper to have a stable shape, and to thereby provide a display device with improved reliability.

According to embodiments, an etchant composition may include about 5.0 to about 20.0 wt % of a persulfate, about 0.01 to about 15.0 wt % of a sulfonic acid, about 0.01 to about 2.0 wt % of a fluorine compound, about 0.01 to about 5.0 wt % of a 4-nitrogen cyclic compound, about 0.01 to about 1.0 wt % of an amino acid including a hydrophobic group having at least two carbon atoms, and water. A weight ratio of the amino acid to the 4-nitrogen cyclic compound may be in a range of about 1:16 to about 1:60.

According to embodiments, the persulfate may include ammonium persulfate, sodium persulfate, potassium persulfate, peroxide disulfuric acid, or a combination thereof.

According to embodiments, the etchant composition may further include about 0.01 to about 10 wt % of a hydrogen sulfate, and the hydrogen sulfate may include ammonium hydrogen sulfate, potassium hydrogen sulfate, sodium hydrogen sulfate, or a combination thereof.

According to embodiments, the sulfonic acid may include a sulfamic acid, a methylsulfamic acid, a methanesulfonic acid, an aminomethanesulfonic acid, an ethanesulfonic acid, a benzenesulfonic acid, a toluenesulfonic acid, a vinylsulfonic acid, or a combination thereof.

According to embodiments, the etchant composition may further include about 0.01 to about 3 wt % of phosphoric acid or a phosphate, and the phosphate may include ammonium phosphate, sodium phosphate, potassium phosphate, calcium phosphate, lithium phosphate, or a combination thereof.

According to embodiments, the fluorine compound may include a hydrofluoric acid, ammonium fluoride, potassium fluoride, sodium fluoride, ammonium bifluoride, potassium bifluoride, sodium bifluoride, or a combination thereof.

According to embodiments, the 4-nitrogen cyclic compound may have an adsorption energy with copper equal to or less than about 0.80 eV, and the 4-nitrogen cyclic compound may include 5-methyltetrazole, 5-methoxy-1H-tetrazole, 1H-tetrazole, or a combination thereof.

According to embodiments, the etchant composition may further include about 0.01 to about 5.0 wt % of a 2-nitrogen cyclic compound having a saturated ring, and the 2-nitrogen cyclic compound may include 2-imidazolidinone, hydantoin, ethylene thiourea, parabanic acid, 1-methylhydantoin, 1,3-dimethyl-2-imidazolidinone, 5,5-dimethylhydantoin, 5-ethylhydantoin, 1-allylhydantoin, or a combination thereof.

According to embodiments, the etchant composition may further include about 0.01 to about 1 wt % of a 3-nitrogen cyclic compound including a thiol group, and the 3-nitrogen cyclic compound may include 3-mercapto-1,2,4-triazole, 3-mercapto-4-methyl-4H-1,2,4-triazole, 3-amino-1,2,3-triazole-5-thiol, 3-amino-1,2,4-triazole-5-thiol, 1H-1,2,4-triazole-3-thiol, or a combination thereof.

According to embodiments, the amino acid may include a compound represented by Chemical Formula 1.

[Chemical Formula 1]

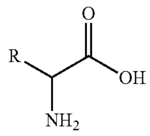

In Chemical Formula 1, R may be hydrogen, deuterium, a halogen group, a hydroxyl group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof.

According to embodiments, the amino acid may include valine, isoleucine, leucine, methionine, phenylalanine, tyrosine, tryptophan, or a combination thereof.

According to embodiments, a manufacturing method of a display device may include forming a metal layer including copper on a substrate; forming a transistor on the metal layer, and etching the metal layer with an etchant composition. The etchant composition may include about 5.0 to about 20.0 wt % of a persulfate, about 0.01 to about 15.0 wt % of a sulfonic acid, about 0.01 to about 2.0 wt % of a fluorine compound, about 0.01 to about 5.0 wt % of a 4-nitrogen cyclic compound, about 0.01 to about 1.0 wt % of an amino acid including a hydrophobic group having at least two carbon atoms, and water. A weight ratio of the amino acid to the 4-nitrogen cyclic compound may be in a range of about 1:16 to about 1:60.

It is to be understood that the embodiments above are described in a generic and explanatory sense only and not for the purpose of limitation, and the disclosure is not limited to the embodiments described above.

According to the embodiments, a wire including copper may be etched to have a stable shape. By using such an etchant composition, it is possible to provide a display device with improved reliability.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
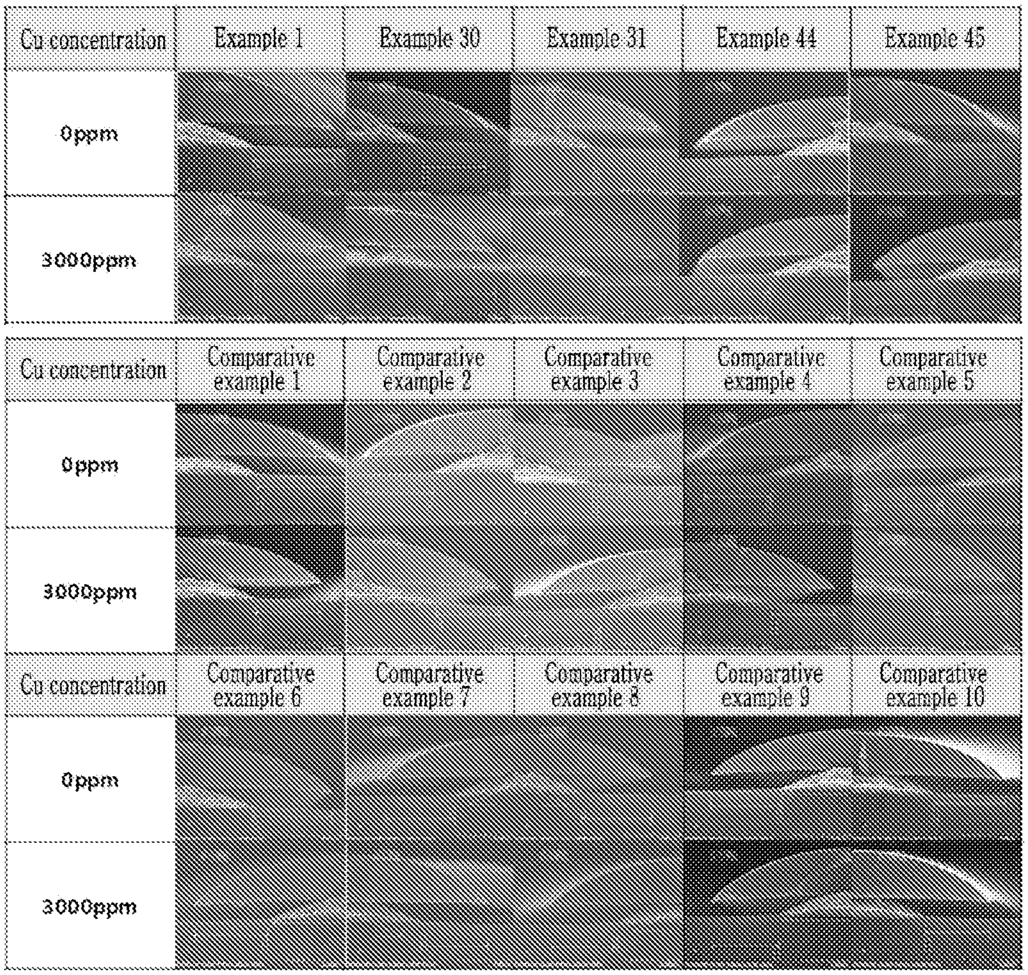
FIG. 1 illustrates an image showing a side surface of a copper wire etched by using an etchant according to examples and Comparative Example 1 to Comparative Example 10.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be more thorough and complete, and will fully convey the scope of the disclosure to those skilled in the art.

To clearly describe the disclosure, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the disclosure is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification, the phrase "in a plan view" means when an object portion is viewed from above, and the phrase "in a cross-sectional view" means when a cross-section taken by vertically cutting an object portion is viewed from the side.

In the specification, the term "2-nitrogen cyclic compound" refers to a compound that includes a cyclic moiety containing two nitrogen atoms. In the specification, the term "3-nitrogen cyclic compound" refers to a compound that includes a cyclic moiety containing three nitrogen atoms. In the specification, the term "4-nitrogen cyclic compound" refers to a compound that includes a cyclic moiety containing four nitrogen atoms.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

An etchant composition according to an embodiment may include: about 5.0 to about 20.0 wt % of a persulfate; about 0.01 to about 10.0 wt % of a hydrogen sulfate; about 0.01 to about 15.0 wt % of a sulfonic acid; about 0.01 to about 3.0 wt % of phosphoric acid or a phosphate; about 0.01 to about 2.0 wt % of a fluorine compound; about 0.01 to about 5.0 wt % of a 4-nitrogen cyclic compound; about 0.01 to about 5.0 wt % of a 2-nitrogen cyclic compound having a saturated ring; about 0.01 to about 1.0 wt % of a 3-nitrogen cyclic compound including a thiol group; about 0.01 to about 1.0 wt % of an amino acid including a hydrophobic group having at least two carbon atoms, and water.

The etchant composition according to an embodiment may etch a wire including copper, and for example, may simultaneously etch a wire in which titanium and copper are stacked each other.

The etchant composition according to an embodiment may include a persulfate in a range of about 5.0 to about 20.0 wt %. The persulfate may include at least one of ammonium persulfate, sodium persulfate, potassium persulfate, or peroxide disulfuric acid.

The persulfate may be a main oxidizing etchant for a copper wire. In case that a content of the persulfate is less than about 5 wt %, there may be a problem in that an etching rate of copper is lowered so sufficient etching is not performed. In case that the content of the persulfate is more than about 20.0 wt %, there may be a problem in that straightness of the copper wire decreases. As the content of the persulfate decreases, the problem of straightness decrease may be resolved. However, since the persulfate is a main oxidizing etchant, about 5.0 wt % or more may be included in order to etch the copper wire.

The etchant composition according to an embodiment may include a hydrogen sulfate in a range of about 0.01 to about 10.0 wt %. The hydrogen sulfate may include ammonium hydrogen sulfate, potassium hydrogen sulfate, sodium hydrogen sulfate, or a combination thereof.

The hydrogen sulfate may be dissociated into hydrogen sulfate ions in the etchant composition to slow a decomposition rate of the persulfate by a strong oxidizing agent such as a sulfamic acid, thereby improving stability over storage. In case that the content of the hydrogen sulfate is less than about 0.01 wt %, there may be a problem that storage stability decreases. In case that the content of the hydrogen sulfate is more than about 10.0 wt %, a copper etching rate may be excessively increased, and thus poor erosion may occur.

The etchant composition according to an embodiment may include a sulfonic acid in a range of about 0.01 to about 15.0 wt %. The sulfonic acid may include a sulfamic acid, a methylsulfamic acid, a methanesulfonic acid, an aminomethanesulfonic acid, a benzenesulfonic acid, a toluenesulfonic acid, a vinylsulfonic acid, or a combination thereof.

The sulfonic acid, which is a strong oxidizing agent, may increase etching rates of copper and titanium wires, and may make a stable state of divalent positive ions while the copper wire is etched. Straightness of a slope of the copper wire may be improved. In case that the content of the sulfonic acid is less than about 0.01 wt %, there may be a problem in that the straightness of the slope of the copper wire decreases. In case that the content of the sulfonic acid is more than about 15.0 wt %, the copper etching rate may be excessively increased to overetch a metal layer.

The etching solution composition according to an embodiment may include a phosphoric acid or a phosphate in a range of about 0.01 to about 3.0 wt %. The phosphate may include ammonium phosphate, sodium phosphate, potassium phosphate, calcium phosphate, lithium phosphate, or a combination thereof.

The phosphoric acid or the phosphate may reduce a taper angle of a signal wire by controlling galvanic corrosion of the copper wire and the titanium wire, and may serve to maintain the taper angle even in case that copper ions in the etchant increase. In case that the content of the phosphoric acid or the phosphate is less than about 0.01 wt %, the etching rate of the lower titanium layer may be not slowed down, so that the taper angle may be increased, and defects due to a step coverage difference may occur. In case that the content of the phosphoric acid or the phosphate is more than about 3.0 wt %, initial taper angles of the copper film and the titanium film may be too low, so that a volume of the wire may be reduced and charge mobility may be lowered.

The etchant composition according to an embodiment may include a fluorine compound in a range of about 0.01 to about 2.0 wt %. The fluorine compound may include a hydrofluoric acid, ammonium fluoride, potassium fluoride, sodium fluoride, ammonium bifluoride, potassium bifluoride, sodium bifluoride, or a combination thereof. The fluorine compound may etch the wire made of titanium. In case that the content of the fluorine compound is less than about 0.1 wt %, the etching of the titanium film may not be effectively performed. In case that the content of the fluorine compound exceeds about 2.0 wt %, the titanium film may be overetched, and accordingly, an undercut may be generated under a titanium-containing metal film, there may be a problem in that an insulating layer or a substrate under the metal layer is additionally etched.

The etchant composition according to an embodiment may include a 4-nitrogen cyclic compound in an amount of about 0.01 to about 5.0 wt %. The 4-nitrogen cyclic compound may include 5-methyltetrazole, 5-methoxy-1H-tetrazole, 1H-tetrazole, or a combination thereof.

The 4-nitrogen cyclic compound may serve as an anti-corrosive agent for copper to control the etching rate. It is also possible to improve a straightness of a slope of a wire made of copper. For the 4-nitrogen cyclic compound, a compound having an adsorption energy with copper equal to or less than about 0.80 eV may be suitable, and in case that the absorption energy exceeds about 0.80 eV, a straightness of the slope of the copper wire may decrease. In case that the straightness of the slope of the wire decreases, a tapered shape of the wire may create a defect, which may generate a seam on an insulating layer as in a comparative example to be described later, thereby causing a device defect. In case that the content of the 4-nitrogen cyclic compound is less than about 0.01 wt %, the etching rate of the copper film may be excessively increased, and thus it may be difficult to control an etching degree of the metal film. In case that the content of the 4-nitrogen cyclic compound is more than about 5.0 wt %, the etching rate may be reduced, and thus process capability of an etching process may be reduced.

The etchant composition according to an embodiment may include about 0.01 to about 5.0 wt % of a 2-nitrogen cyclic compound having a saturated ring. The 2-nitrogen cyclic compound having a saturated ring may include 2-imidazolidinone, hydantoin, ethylene thiourea, parabanic acid, 1-methylhydantoin, 1,3-dimethyl-2-imidazolidinone, 5,5-dimethylhydantoin, 5-ethylhydantoin, 1-allylhydantoin, or a combination thereof.

When the persulfate etches the copper wire, sulfate radicals may be generated. The generated sulfate radicals may attack and decompose the 4-nitrogen cyclic compound. Some of the decomposition products generated by decomposition of the 4-nitrogen cyclic compound may be adsorbed to the copper wire, thereby reducing an etching force of the copper wire. The 2-nitrogen cyclic compound having a saturated ring may serve as a sulfate radical scavenger to prevent decomposition of the 4-nitrogen cyclic compound, thereby improving etching ability of the copper wire. In case that the content of the 2-nitrogen cyclic compound having a saturated ring, is less than about 0.01 wt %, a radical scavenger function may not be sufficiently performed, and the decomposition of the 4-nitrogen cyclic compound in the etchant composition may not be suppressed, and thus etching performance may be reduced. In case that the content of the 2-nitrogen cyclic compound having a saturated ring, is more than about 5.0 wt %, the 2-nitrogen cyclic compound having a saturated ring, may be adsorbed to the metal film, thereby decreasing the etching performance of the etchant composition.

The etchant composition according to an embodiment may include a 3-nitrogen cyclic compound including a thiol group in a range of about 0.01 to about 1.0 wt %. The 3-nitrogen cyclic compound including a thiol group may include 3-mercapto-1,2,4-triazole, 3-amino-1,2,4-triazole-5-thiol, 3-mercapto-4-methyl-4H-1,2,4-triazole, 3-amino-1,2,3-triazole-5-thiol, 1H-1,2,4-triazole-3-thiol, or a combination thereof.

When the persulfate etches the copper wire, oxygen radicals may be generated in addition to the sulfate radicals. The generated oxygen radicals may attack and decompose the 2-nitrogen cyclic compound. In case that the 2-nitrogen cyclic compound is decomposed, it may not function as a sulfate radical scavenger, and the 4-nitrogen cyclic compound may be decomposed. Thus, the etching ability of the copper wire may be reduced by a generated decomposition product. The 3-nitrogen cyclic compound having a thiol group may serve as an oxygen radical scavenger to prevent decomposition of the 2-nitrogen cyclic compound and may prevent decomposition of the 4-nitrogen cyclic compound, thereby improving the etching ability of the copper wire.

The etchant composition according to an embodiment may include an amino acid including a hydrophobic group having at least two carbon atoms in a range of about 0.01 to about 1.0 wt %.

The amino acid including a hydrophobic group having at least two carbon atoms may include a compound represented by Chemical Formula 1.

[Chemical Formula 1]

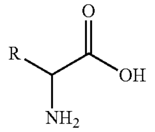

In Chemical Formula 1, R may be hydrogen, deuterium, a halogen group, a hydroxyl group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof.

The amino acid including a hydrophobic group having at least two carbon atoms may include valine, isoleucine, leucine, methionine, phenylalanine, tyrosine, tryptophan, or a combination thereof.

The amino acid including a hydrophobic group having at least two carbon atoms may be adsorbed in an upper portion of the copper wire to improve straightness of the upper portion of the copper wire. In case that an amino acid including an electrically charged chain is used, straightness of the etched copper wire may decrease. A ratio of the amino acid including a hydrophobic group having at least two carbon atoms to the 4-nitrogen cyclic compound may be about 1:16 to about 1:60. In case that the ratio is less than about 1:16, upper straightness of the etched copper wire may decrease, and in case that the ratio is greater than about 1:60, straightness of the slope of the etched copper wire may decrease.

Hereinafter, the disclosure will be described in more detail with examples. The following examples are provided to describe the disclosure in more detail, and the scope of the disclosure is not limited by the following examples. The following examples may be appropriately modified and changed by those skilled in the art within the scope of the disclosure.

<Preparation of Etchant Composition>

Etchants of Examples 1 to 45 and Comparative Examples 1 to 10 according to the etchant composition as described above were prepared as shown in Table 1 below. % in Table 1 below indicates wt %.

TABLE 1

| | Persulfate | Hydrogen sulfate | Sulfonic acid | Phosphoric acid or phosphate | Fluorine compound | 4-nitrogen cyclic compound | 2-nitrogen cyclic compound having a saturated ring | 3-nitrogen cyclic compound including a thiol group | Amino acids with hydrophobic groups having two or more carbon atoms |
|---|---|---|---|---|---|---|---|---|---|
| Example 1 | 5 | 0.2 | 10 | 1.5 | 0.5 | 0.8 | 0.5 | 0.1 | 0.05 |
| Example 2 | 10 | 0.2 | 10 | 1.5 | 0.5 | 0.8 | 0.5 | 0.1 | 0.05 |
| Example 3 | 15 | 0.2 | 10 | 1.5 | 0.5 | 0.8 | 0.5 | 0.1 | 0.05 |

TABLE 1-continued

| | Persulfate | Hydrogen sulfate | Sulfonic acid | Phosphoric acid or phosphate | Fluorine compound | 4-nitrogen cyclic compound | 2-nitrogen cyclic compound having a saturated ring | 3-nitrogen cyclic compound including a thiol group | Amino acids with hydrophobic groups having two or more carbon atoms |
|---|---|---|---|---|---|---|---|---|---|
| Example 4 | 20 | 0.2 | 10 | 1.5 | 0.5 | 0.8 | 0.5 | 0.1 | 0.05 |
| Example 5 | 15 | 0.005 | 10 | 1.5 | 0.5 | 0.8 | 0.5 | 0.1 | 0.05 |
| Example 6 | 15 | 0.01 | 10 | 1.5 | 0.5 | 0.8 | 0.5 | 0.1 | 0.05 |
| Example 7 | 15 | 0.1 | 10 | 1.5 | 0.5 | 0.8 | 0.5 | 0.1 | 0.05 |
| Example 8 | 15 | 1 | 10 | 1.5 | 0.5 | 0.8 | 0.5 | 0.1 | 0.05 |
| Example 9 | 15 | 5 | 10 | 1.5 | 0.5 | 0.8 | 0.5 | 0.1 | 0.05 |
| Example 10 | 15 | 8 | 10 | 1.5 | 0.5 | 0.8 | 0.5 | 0.1 | 0.05 |
| Example 11 | 15 | 10 | 10 | 1.5 | 0.5 | 0.8 | 0.5 | 0.1 | 0.05 |
| Example 12 | 15 | 12 | 10 | 1.5 | 0.5 | 0.8 | 0.5 | 0.1 | 0.05 |
| Example 13 | 15 | 0.2 | 0.01 | 1.5 | 0.5 | 0.8 | 0.5 | 0.1 | 0.05 |
| Example 14 | 15 | 0.2 | 1 | 1.5 | 0.5 | 0.8 | 0.5 | 0.1 | 0.05 |
| Example 15 | 15 | 0.2 | 5 | 1.5 | 0.5 | 0.8 | 0.5 | 0.1 | 0.05 |
| Example 16 | 15 | 0.2 | 10 | 1.5 | 0.5 | 0.8 | 0.5 | 0.1 | 0.05 |
| Example 17 | 15 | 0.2 | 15 | 1.5 | 0.5 | 0.8 | 0.5 | 0.1 | 0.05 |
| Example 18 | 10 | 0.2 | 10 | 0.005 | 0.5 | 0.8 | 0.5 | 0.1 | 0.05 |
| Example 19 | 15 | 0.2 | 10 | 0.01 | 0.5 | 0.8 | 0.5 | 0.1 | 0.05 |
| Example 20 | 10 | 0.2 | 10 | 1 | 0.5 | 0.8 | 0.5 | 0.1 | 0.05 |
| Example 21 | 10 | 0.2 | 10 | 2 | 0.5 | 0.8 | 0.5 | 0.1 | 0.05 |
| Example 22 | 15 | 0.2 | 10 | 3 | 0.5 | 0.8 | 0.5 | 0.1 | 0.05 |
| Example 23 | 15 | 0.2 | 10 | 3.5 | 0.5 | 0.8 | 0.5 | 0.1 | 0.05 |
| Example 24 | 15 | 0.2 | 10 | 1.5 | 0.01 | 0.8 | 0.5 | 0.1 | 0.05 |
| Example 25 | 15 | 0.2 | 10 | 1.5 | 0.1 | 0.8 | 0.5 | 0.1 | 0.05 |
| Example 26 | 15 | 0.2 | 10 | 1.5 | 1 | 0.8 | 0.5 | 0.1 | 0.05 |
| Example 27 | 15 | 0.2 | 10 | 1.5 | 2 | 0.8 | 0.5 | 0.1 | 0.05 |
| Example 28 | 15 | 0.2 | 10 | 1.5 | 0.5 | 0.01 | 0.5 | 0.1 | 0.05 |
| Example 29 | 15 | 0.2 | 10 | 1.5 | 0.5 | 0.1 | 0.5 | 0.1 | 0.05 |
| Example 30 | 15 | 0.2 | 10 | 1.5 | 0.5 | 1.5 | 0.5 | 0.1 | 0.05 |
| Example 31 | 15 | 0.2 | 10 | 1.5 | 0.5 | 3 | 0.5 | 0.1 | 0.05 |
| Example 32 | 15 | 0.2 | 10 | 1.5 | 0.5 | 5 | 0.5 | 0.1 | 0.05 |
| Example 33 | 15 | 0.2 | 10 | 1.5 | 0.5 | 0.8 | 0.005 | 0.1 | 0.05 |
| Example 34 | 15 | 0.2 | 10 | 1.5 | 0.5 | 0.8 | 0.01 | 0.1 | 0.05 |
| Example 35 | 15 | 0.2 | 10 | 1.5 | 0.5 | 0.8 | 0.1 | 0.1 | 0.05 |
| Example 36 | 15 | 0.2 | 10 | 1.5 | 0.5 | 0.8 | 1 | 0.1 | 0.05 |
| Example 37 | 15 | 0.2 | 10 | 1.5 | 0.5 | 0.8 | 3 | 0.1 | 0.05 |
| Example 38 | 15 | 0.2 | 10 | 1.5 | 0.5 | 0.8 | 5 | 0.1 | 0.05 |
| Example 39 | 15 | 0.2 | 10 | 1.5 | 0.5 | 0.8 | 5.5 | 0.1 | 0.05 |
| Example 40 | 15 | 0.2 | 10 | 1.5 | 0.5 | 0.8 | 0.5 | 0.005 | 0.05 |
| Example 41 | 15 | 0.2 | 10 | 1.5 | 0.5 | 0.8 | 0.5 | 0.01 | 0.05 |
| Example 42 | 15 | 0.2 | 10 | 1.5 | 0.5 | 0.8 | 0.5 | 1 | 0.05 |
| Example 43 | 15 | 0.2 | 10 | 1.5 | 0.5 | 0.8 | 0.5 | 1.5 | 0.05 |
| Example 44 | 15 | 0.2 | 10 | 1.5 | 0.5 | 0.8 | 0.5 | 0.1 | 0.01 |
| Example 45 | 15 | 0.2 | 10 | 1.5 | 0.5 | 0.8 | 0.5 | 0.1 | 1 |
| Comparative Example 1 | 3 | 0.2 | 10 | 1.5 | 0.5 | 0.8 | 0.5 | 0.1 | 0.05 |
| Comparative Example 2 | 22 | 0.2 | 10 | 1.5 | 0.5 | 0.8 | 0.5 | 0.1 | 0.05 |
| Comparative Example 3 | 15 | 0.2 | 0.005 | 1.5 | 0.5 | 0.8 | 0.5 | 0.1 | 0.05 |
| Comparative Example 4 | 15 | 0.2 | 17 | 1.5 | 0.5 | 0.8 | 0.5 | 0.1 | 0.05 |
| Comparative Example 5 | 15 | 0.2 | 10 | 1.5 | 0.005 | 0.8 | 0.5 | 0.1 | 0.05 |
| Comparative Example 6 | 15 | 0.2 | 10 | 1.5 | 3 | 0.8 | 0.5 | 0.1 | 0.05 |
| Comparative Example 7 | 15 | 0.2 | 10 | 1.5 | 0.5 | 0.005 | 0.5 | 0.1 | 0.05 |
| Comparative Example 8 | 15 | 0.2 | 10 | 1.5 | 0.5 | 6 | 0.5 | 0.1 | 0.05 |
| Comparative Example 9 | 15 | 0.2 | 10 | 1.5 | 0.5 | 0.8 | 0.5 | 0.1 | 0.005 |
| Comparative Example 10 | 15 | 0.2 | 10 | 1.5 | 0.5 | 0.8 | 0.5 | 0.1 | 1.5 |

For Examples 1 to 45 and Comparative Examples 1 to 10, when a titanium/copper double layer was etched, characteristics were evaluated after etching the layers at a same over-etch rate based on end point detection (EPD) of an upper copper layer. As illustrated in Table 2, the evaluated characteristics were straightness, processing capacity, and an etch rate, and thy were measured with a scanning electron microscope.

In Table 2, performance levels of the three main characteristics are specified and indicated as levels (excellent: O, average: Δ, poor: X). A range of composition may be determined by including cases where all three main characteristics are excellent.

TABLE 2

| | Straightness (LER) | Processing capacity | Etch rate |
|---|---|---|---|
| Example 1 | ○ 0.17 | ○ | ○ |
| Example 2 | ○ 0.18 | ○ | ○ |
| Example 3 | ○ 0.18 | ○ | ○ |
| Example 4 | ○ 0.19 | ○ | ○ |
| Example 5 | ○ 0.17 | Δ | ○ |
| Example 6 | ○ 0.17 | ○ | ○ |
| Example 7 | ○ 0.18 | ○ | ○ |
| Example 8 | ○ 0.18 | ○ | ○ |
| Example 9 | ○ 0.19 | ○ | ○ |
| Example 10 | ○ 0.19 | ○ | ○ |
| Example 11 | ○ 0.19 | ○ | ○ |
| Example 12 | Δ 0.21 | ○ | ○ |
| Example 13 | ○ 0.19 | ○ | ○ |
| Example 14 | ○ 0.19 | ○ | ○ |
| Example 15 | ○ 0.18 | ○ | ○ |
| Example 16 | ○ 0.18 | ○ | ○ |
| Example 17 | ○ 0.17 | ○ | ○ |
| Example 18 | ○ 0.17 | Δ | ○ |
| Example 19 | ○ 0.17 | ○ | ○ |
| Example 20 | ○ 0.18 | ○ | ○ |
| Example 21 | ○ 0.18 | ○ | ○ |
| Example 22 | ○ 0.19 | ○ | ○ |
| Example 23 | Δ 0.20 | ○ | ○ |
| Example 24 | ○ 0.18 | ○ | ○ |
| Example 25 | ○ 0.18 | ○ | ○ |
| Example 26 | ○ 0.18 | ○ | ○ |
| Example 27 | ○ 0.18 | ○ | ○ |
| Example 28 | Δ 0.22 | ○ | ○ |
| Example 29 | Δ 0.21 | ○ | ○ |
| Example 30 | ○ 0.18 | ○ | ○ |
| Example 31 | ○ 0.17 | ○ | ○ |
| Example 32 | ○ 0.17 | ○ | ○ |
| Example 33 | ○ 0.19 | ○ | Δ |
| Example 34 | ○ 0.19 | ○ | ○ |
| Example 35 | ○ 0.19 | ○ | ○ |
| Example 36 | ○ 0.18 | ○ | ○ |
| Example 37 | ○ 0.18 | ○ | ○ |
| Example 38 | ○ 0.17 | ○ | ○ |
| Example 39 | ○ 0.17 | ○ | Δ |
| Example 40 | ○ 0.19 | Δ | ○ |
| Example 41 | ○ 0.19 | ○ | ○ |
| Example 42 | ○ 0.18 | ○ | ○ |
| Example 43 | ○ 0.17 | ○ | Δ |
| Example 44 | ○ 0.18 | ○ | ○ |
| Example 45 | ○ 0.18 | ○ | ○ |
| Comparative Example 1 | ○ 0.19 | X | Δ |
| Comparative Example 2 | Δ 0.21 | ○ | X |
| Comparative Example 3 | ○ 0.19 | X | Δ |
| Comparative Example 4 | ○ 0.17 | ○ | X |
| Comparative Example 5 | ○ 0.19 | Δ | Δ |
| Comparative Example 6 | ○ 0.19 | Δ | X |
| Comparative Example 7 | X 0.30 | ○ | X |

TABLE 2-continued

| | Straightness (LER) | Processing capacity | Etch rate |
|---|---|---|---|
| Comparative Example 8 | Δ 0.25 | X | Δ |
| Comparative Example 9 | X 0.31 | ○ | ○ |
| Comparative Example 10 | X 0.32 | Δ | Δ |

For Examples 1 to 45 of Table 1, as shown in Table 2, it was confirmed that straightness, processing capacity, and etching rate characteristics were all satisfied within a content of each component. In the specification, the processing capacity may include that an etching profile is maintained until a new etchant and copper ions of each example become a cumulative solution of 3000 ppm. It was also confirmed that excellent wire straightness was shown in each example. For example, it was confirmed that a taper angle of a wire was stably formed.

In Comparative Examples 1 to 10 in Table 1 and Table 2, it was confirmed that defects occurred in case that each component was excluded or out of the content range. For example, in Comparative Example 1, it was confirmed that, in case that the content of the persulfate was less than the content range, the copper etching rate was slow and the processing capacity was reduced due to the insufficient content of the main oxidizing etchant. In Comparative Example 2, it was confirmed that, in case that the persulfate content exceeds the content range, the etching rate was high due to excessive sulfate ions, making it difficult to control a process tact time. In Comparative Example 3, it was confirmed that, in case that the content of the sulfonic acid was less than the content range, the processing capacity was decreased due to lack of the oxidizing agent, and the etching rate was decreased. In Comparative Example 4, it was confirmed that, in case that the content of the sulfonic acid exceeds the content range, the etching rate was high, making it difficult to control a process tact time. In Comparative Example 5, it was confirmed that, in case that the content of the fluorine compound was less than the content range, a lower titanium film could not be etched. In Comparative Example 6, it was confirmed that undercut and damage to a glass substrate increased due to over-etching of the titanium film in case that the content of the fluorine compound exceeded the content range. In Comparative Example 7, it was confirmed that, in case that the content of the 4-nitrogen cyclic compound was less than the content range, it was difficult to control the process tact time due to an increase of the copper etching rate, and the straightness was lowered. In Comparative Example 8, it was confirmed that, in case that the content of the 4-nitrogen cyclic compound exceeds the content range, the etching rate of the copper wire was low, the compound was adsorbed to the copper, so that the processing capacity was reduced, and the straightness was lowered. In Comparative Example 9, it was confirmed that, in case that the content of the amino acid including a hydrophobic group having at least two carbon atoms was less than the content range, it was confirmed that the straightness of the copper wire decreased. In Comparative Example 10, it was confirmed that, in case that the amino acid including a hydrophobic group having at least two carbon atoms exceeds the content range, it was adsorbed to the copper, so that the copper etch rate was decreased, the processing capacity was reduced, and the straightness was lowered.

Figure 2:
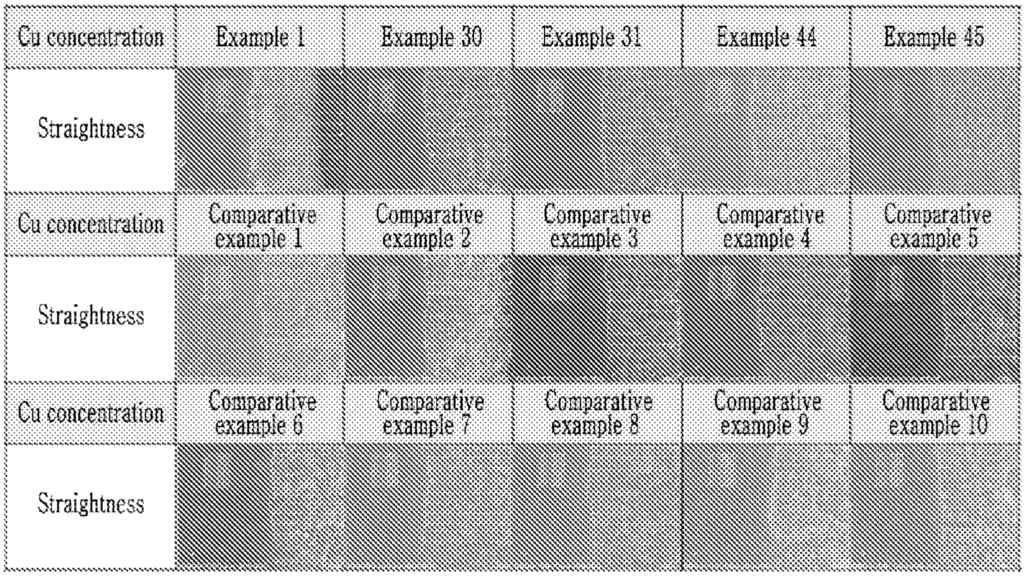
FIG. 2 illustrates an image showing an upper surface of a copper wire etched by using an etchant according to examples and Comparative Example 1 to Comparative Example 10.

FIG. 1 illustrates etching profile until a new etchant and copper ions become a cumulative solution of 3000 ppm in each example and comparative example, and FIG. 2 illustrates the wire straightness of each example and comparative example.

As illustrated in FIG. 1, it was confirmed that the etching profile was maintained until the new etchant and the copper ions become the cumulative solution of 3000 ppm in each example compared to the comparative examples. In FIG. 2, it was confirmed that each example exhibited superior wire straightness compared to the comparative examples. For example, it was confirmed that a taper angle of a wire was stably formed.

Figure 3:
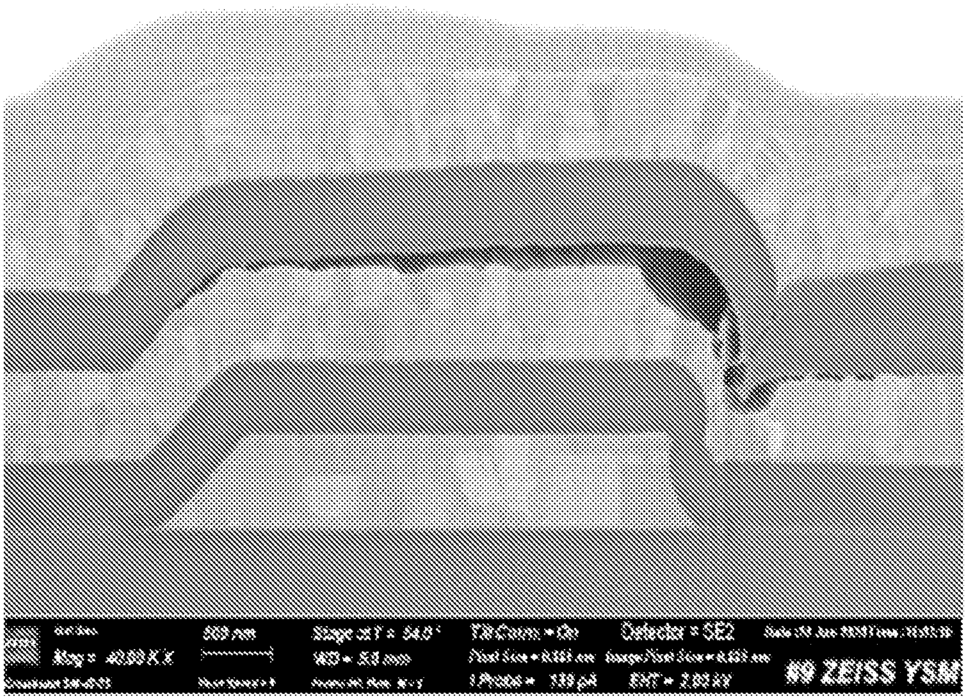
FIG. 3 illustrates an image showing a region of a display device after etching is performed using an etchant composition according to a comparative example.

Referring to FIG. 3, in case that an etchant composition according to a comparative example is used, the tapered shape of the wire positioned at a lower end may be non-uniform or may be too close to a right angle. As such, in case that the tapered shape is defective, a defect such as a seam may be formed on insulating layers formed on the wire, and corrosion of the wire may occur during a cleaning process or an etching process.

Figure 4:
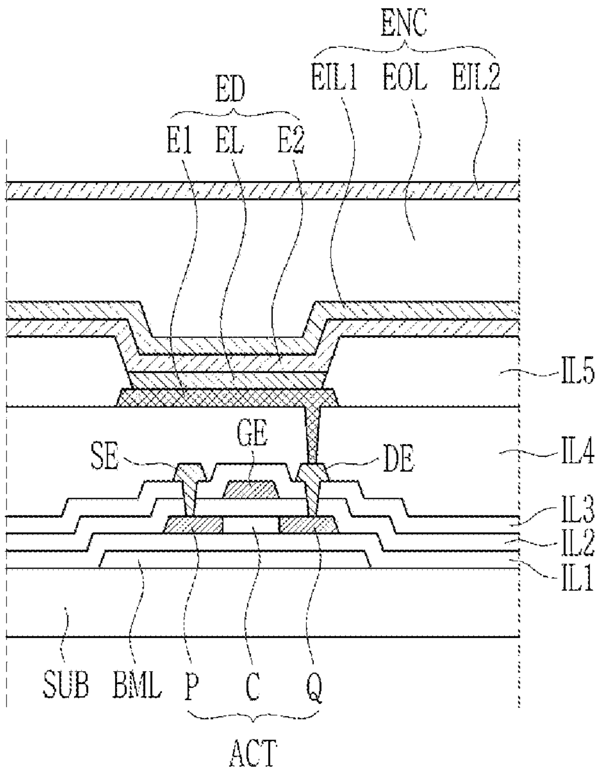
FIG. 4 illustrates a schematic cross-sectional view of a display device according to an embodiment.

A display device according to an embodiment will now be described with reference to FIG. 4. FIG. 4 illustrates a schematic cross-sectional view of a display device according to an embodiment.

Referring to FIG. 4, a display device according to an embodiment may include a substrate SUB. The substrate SUB may have various degrees of flexibility. The substrate SUB may be a rigid substrate or a flexible substrate capable of bending, folding, rolling, or the like.

The substrate SUB may include a glass material or a polymer resin. For example, the polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, or a combination thereof. The substrate SUB may have a multi-layered structure including a layer including the aforementioned polymer resin and an inorganic layer (not illustrated).

A metal layer BML may be disposed on the substrate SUB. The metal layer BML may include molybdenum (Mo), aluminum (Al), copper (Cu), silver (Ag), chromium (Cr), tantalum (Ta), titanium (Ti), or the like. The metal layer BML according to an embodiment may be formed as at least a double layer, and may include, e.g., a first layer including titanium and a second layer including copper. The metal layer BML according to an embodiment may be formed through etching with the above-described etchant composition, and thus may have a stable tapered shape.

A buffer layer IL1 may be disposed on the substrate SUB and the metal layer BML. The buffer layer IL1 may prevent impurities from being transferred from the substrate SUB to an upper layer of the buffer layer IL1 particularly a semiconductor layer ACT, thereby preventing deterioration of a characteristic of the semiconductor layer ACT and reducing stress. The buffer layer IL1 may be a single layer or multiple layers including a silicon oxide ($SiO_x$), a silicon nitride ($SiN_x$), a silicon oxynitride ($SiO_xN_y$), or a combination thereof. A portion or an entire portion of the buffer layer IL1 may be omitted.

The semiconductor layer ACT may be disposed on the buffer layer IL1.

The semiconductor layer ACT may include polysilicon, an oxide semiconductor, or a combination thereof. The semiconductor layer ACT may include a channel region C, a first region P, and a second region Q. The first region P and the second region Q may be disposed at opposite sides of the channel region C, respectively. The channel region C may be doped with a small amount of impurities or may be a semiconductor that is not doped with impurities, and the first region P and the second region Q may include a semiconductor doped with larger amount of impurities compared to the channel region C. The semiconductor layer ACT may be formed by using an oxide semiconductor, and a separate protective layer (not illustrated) may be disposed to protect an oxide semiconductor material that is vulnerable to external environments such as a high temperature.

A first insulating layer IL2 may be disposed on the semiconductor layer ACT. A gate electrode GE may be positioned on the first insulating layer IL2.

The gate electrode GE may be a single layer or a multilayer in which metal layer including any one of copper (Cu), a copper alloy, aluminum (Al), an aluminum alloy, molybdenum (Mo), a molybdenum alloy, titanium (Ti), and a titanium alloy are stacked each other. The gate electrode GE may overlap the channel region C of the semiconductor layer ACT.

A second insulating layer IL3 may be positioned on the gate electrode GE and the first insulating layer IL2. The first insulating layer IL2 and the second insulating layer IL3 may be a single layer or multiple layers including at least one inorganic insulating materials such as a silicon oxide, a silicon nitride, a silicon oxynitride, an aluminum oxide, a titanium oxide, a tantalum oxide, a hafnium oxide, or a combination thereof.

A source electrode SE and a drain electrode DE may be positioned on the second insulating layer IL3. The source electrode SE and the drain electrode DE may be respectively electrically connected to the first region P and the second region Q of the semiconductor layer ACT through contact holes formed in the first insulating layer IL2 and the second insulating layer IL3.

The source electrode SE and the drain electrode DE may include a conductive material including molybdenum (Mo), aluminum (Al), copper (Cu), titanium (Ti), and the like, and may be formed as a multilayer or a single layer including the above materials. In an embodiment, the source electrode SE and the drain electrode DE may have a multi-layer structure (Ti/Al/Ti) of a titanium layer, an aluminum layer, and a titanium layer.

A third insulating layer IL4 may be disposed on the source electrode SE and the drain electrode DE. A first electrode E1 may be disposed on the third insulating layer IL4.

The first electrode E1 may include a metal such as silver (Ag), lithium (Li), calcium (Ca), aluminum (Al), magnesium (Mg), and gold (Au), and may also include a transparent conductive oxide (TCO) such as an indium zinc oxide (IZO) and an indium tin oxide (ITO).

The first electrode E1 may be formed as a single layer including a metal material or a transparent conductive oxide, or a multiple layer including the same. For example, the first electrode E1 may have a triple layer structure of a first layer including an indium tin oxide (ITO), a second layer including silver (Ag), and a third layer including an indium tin oxide (ITO).

A fourth insulating layer IL5 may be disposed on the first electrode E1. The fourth insulating layer IL5 may overlap at least a portion of the first electrode E1. The fourth insulating layer IL5 may have an opening defining an emission region. For example, a width of the opening exposing an upper surface of the first electrode E1 may correspond to a width of the emission region from which light is emitted or a width of the pixel. The opening may have a rhombus or octagonal shape that is similar to a rhombus in a plan view, but the disclosure is not limited thereto, and may have any shape such as a quadrangle, a polygon, a circle, or an oval.

The third insulating layer IL4 and the fourth insulating layer IL5 may include a general purpose polymer such as poly(methyl methacrylate) (PMMA) or polystyrene (PS), a polymer derivative having a phenolic group, or an organic insulating material such as an acrylic polymer, an imide polymer, a polyimide, an acrylic polymer, a siloxane polymer, etc.

An emission layer EL may be disposed on the first electrode E1. The emission layer EL may include an organic material and/or an inorganic material. The emission layer EML1 may generate a color light.

A second electrode E2 may be disposed on the emission layer EL. The second electrode E2 may include a reflective metal including calcium (Ca), barium (Ba), magnesium (Mg), aluminum (Al), silver (Ag), gold (Au), nickel (Ni), chromium (Cr), lithium (Li), calcium (Ca), etc., or a transparent conductive oxide (TCO) such as an indium tin oxide (ITO) or an indium zinc oxide (IZO).

The first electrode E1, the emission layer EL, and the second electrode E2 may constitute a light emitting diode ED. Herein, the first electrode E1 may be an anode which is a hole injection electrode, and the second electrode E2 may be a cathode which is an electron injection electrode. However, the disclosure is not limited thereto, and the first electrode E1 may be a cathode and the second electrode E2 may be an anode depending on a driving method of an emissive display device.

In case that holes and electrons are injected from the first electrode E1 and the second electrode E2 into the emission layer (EL), excitons formed by combining the injected holes and electrons may be emitted as they fall from an excited state to a ground state.

An encapsulation layer ENC may be disposed on the second electrode E2. The encapsulation layer ENC may cover and seal the upper surface and the side surfaces of the light emitting element. Since the light emitting diode ED is very vulnerable to moisture and oxygen, the encapsulation layer ENC may seal the light emitting element to block inflow of moisture and oxygen from the outside.

The encapsulation layer ENC may include multiple layers, and may be formed of a composite film including an inorganic layer and an organic layer, and for example, may be formed as a triple layer in which a first inorganic encapsulation layer EIL1, an encapsulation organic layer EOL, and a second inorganic encapsulation layer EIL2 are sequentially formed.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. An etchant composition comprising:

about 5.0 to about 20.0 wt % of a persulfate;

about 0.01 to about 15.0 wt % of a sulfonic acid;

about 0.01 to about 2.0 wt % of a fluorine compound;

about 0.01 to about 5.0 wt % of a 4-nitrogen cyclic compound;

about 0.01 to about 1.0 wt % of an amino acid including a hydrophobic group having at least two carbon atoms; and water, wherein a weight ratio of the amino acid to the 4-nitrogen cyclic compound is in a range of about 1:16 to about 1:60.

2. The etchant composition of claim 1, wherein the persulfate includes ammonium persulfate, sodium persulfate, potassium persulfate, peroxide disulfuric acid, or a combination thereof.

3. The etchant composition of claim 1, further comprising:

about 0.01 to about 10 wt % of a hydrogen sulfate, wherein the hydrogen sulfate includes ammonium hydrogen sulfate, potassium hydrogen sulfate, sodium hydrogen sulfate, or a combination thereof.

4. The etchant composition of claim 1, wherein the sulfonic acid includes a sulfamic acid, a methylsulfamic acid, a methanesulfonic acid, an aminomethanesulfonic acid, an ethanesulfonic acid, a benzenesulfonic acid, a toluenesulfonic acid, a vinylsulfonic acid, or a combination thereof.

5. The etchant composition of claim 1, further comprising:

about 0.01 to about 3 wt % of phosphoric acid or a phosphate, wherein the phosphate includes ammonium phosphate, sodium phosphate, potassium phosphate, calcium phosphate, lithium phosphate, or a combination thereof.

6. The etchant composition of claim 1, wherein the fluorine compound includes a hydrofluoric acid, ammonium fluoride, potassium fluoride, sodium fluoride, ammonium bifluoride, potassium bifluoride, sodium bifluoride, or a combination thereof.

7. The etchant composition of claim 1, wherein the 4-nitrogen cyclic compound has an adsorption energy with copper equal to or less than about 0.80 eV, and the 4-nitrogen cyclic compound includes 5-methyltetrazole, 5-methoxy-1H-tetrazole, 1H-tetrazole, or a combination thereof.

8. The etchant composition of claim 1, further comprising:

about 0.01 to about 5.0 wt % of a 2-nitrogen cyclic compound having a saturated ring, wherein the 2-nitrogen cyclic compound includes 2-imidazolidinone, hydantoin, ethylene thiourea, parabanic acid, 1-methylhydantoin, 1,3-dimethyl-2-imidazolidinone, 5,5-dimethylhydantoin, 5-ethylhydantoin, 1-allylhydantoin, or a combination thereof.

9. The etchant composition of claim 1, further comprising:

about 0.01 to about 1 wt % of a 3-nitrogen cyclic compound including a thiol group, wherein the 3-nitrogen cyclic compound includes 3-mercapto-1,2,4-triazole, 3-mercapto-4-methyl-4H-1,2,4-triazole, 3-amino-1,2,3-triazole-5-thiol, 3-amino-1,2,4-triazole-5-thiol, 1H-1,2,4-triazole-3-thiol, or a combination thereof.

10. The etchant composition of claim 1, wherein the amino acid includes a compound represented by Chemical Formula 1:

[Chemical Formula 1]

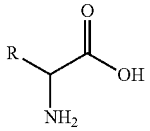

wherein in Chemical Formula 1,

R is hydrogen, deuterium, a halogen group, a hydroxyl group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof.

11. The etchant composition of claim 10, wherein the amino acid includes valine, isoleucine, leucine, methionine, phenylalanine, tyrosine, tryptophan, or a combination thereof.

12. A manufacturing method of a display device, comprising:

forming a metal layer including copper on a substrate;

forming a transistor on the metal layer; and etching the metal layer with an etchant composition, wherein the etchant composition includes:

about 5.0 to about 20.0 wt % of a persulfate;

about 0.01 to about 15.0 wt % of a sulfonic acid;

about 0.01 to about 2.0 wt % of a fluorine compound;

about 0.01 to about 5.0 wt % of a 4-nitrogen cyclic compound;

about 0.01 to about 1.0 wt % of an amino acid including a hydrophobic group having at least two carbon atoms; and water, and a weight ratio of the amino acid to the 4-nitrogen cyclic compound is in a range of about 1:16 to about 1:60.

13. The manufacturing method of claim 12, wherein the persulfate includes ammonium persulfate, sodium persulfate, potassium persulfate, peroxide disulfuric acid, or a combination thereof.

14. The manufacturing method of claim 12, wherein the etchant composition further includes:

about 0.01 to about 10 wt % of a hydrogen sulfate; and about 0.01 to about 3 wt % of phosphoric acid or a phosphate, the hydrogen sulfate includes ammonium hydrogen sulfate, potassium hydrogen sulfate, sodium hydrogen sulfate, or a combination thereof, and the phosphate includes ammonium phosphate, sodium phosphate, potassium phosphate, calcium phosphate, lithium phosphate, or a combination thereof.

15. The manufacturing method of claim 12, wherein the sulfonic acid includes a sulfamic acid, a methylsulfamic acid, a methanesulfonic acid, an aminomethanesulfonic acid, an ethanesulfonic acid, a benzenesulfonic acid, a toluenesulfonic acid, a vinylsulfonic acid, or a combination thereof.

16. The manufacturing method of claim 12, wherein the fluorine compound includes a hydrofluoric acid, ammonium fluoride, potassium fluoride, sodium fluoride, ammonium bifluoride, potassium bifluoride, sodium bifluoride, or a combination thereof.

17. The manufacturing method of claim 12, wherein the 4-nitrogen cyclic compound has an adsorption energy with copper equal to or less than about 0.80 eV, and the 4-nitrogen cyclic compound includes 5-methyltetrazole, 5-methoxy-1H-tetrazole, 1H-tetrazole, or a combination thereof.

18. The manufacturing method of claim 12, wherein the etchant composition further includes about 0.01 to about 5.0 wt % of a 2-nitrogen cyclic compound having a saturated ring, and the 2-nitrogen cyclic compound includes 2-imidazolidinone, hydantoin, ethylene thiourea, parabanic acid, 1-methylhydantoin, 1,3-dimethyl-2-imidazolidinone, 5,5-dimethylhydantoin, 5-ethylhydantoin, 1-allylhydantoin, or a combination thereof.

19. The manufacturing method of claim 12, wherein the etchant composition further includes about 0.01 to about 1 wt % of a 3-nitrogen cyclic compound including a thiol group, and the 3-nitrogen cyclic compound includes 3-mercapto-1,2,4-triazole, 3-mercapto-4-methyl-4H-1,2,4-triazole, 3-amino-1,2,3-triazole-5-thiol, 3-amino-1,2,4-triazole-5-thiol, 1H-1,2,4-triazole-3-thiol, or a combination thereof.

20. The manufacturing method of claim 12, wherein the amino acid includes valine, isoleucine, leucine, methionine, phenylalanine, tyrosine, tryptophan, or a combination thereof.

* * * * *